(12) United States Patent
Li et al.

(10) Patent No.: US 11,031,571 B2
(45) Date of Patent: Jun. 8, 2021

(54) DISPLAY DEVICE AND METHOD FOR PREPARING THE SAME

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Jiewei Li, Beijing (CN); Biao Tian, Beijing (CN); Tao Jin, Beijing (CN); Shihlun Chen, Beijing (CN); Chuan Yin, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/622,869

(22) PCT Filed: Apr. 30, 2019

(86) PCT No.: PCT/CN2019/085124
§ 371 (c)(1),
(2) Date: Dec. 13, 2019

(87) PCT Pub. No.: WO2019/223504
PCT Pub. Date: Nov. 28, 2019

(65) Prior Publication Data
US 2020/0212349 A1    Jul. 2, 2020

(30) Foreign Application Priority Data
May 23, 2018 (CN) .......................... 201810502101.7

(51) Int. Cl.
H01L 51/52 (2006.01)
H01L 27/32 (2006.01)
(Continued)

(52) U.S. Cl.
CPC ...... H01L 51/5228 (2013.01); H01L 27/3244 (2013.01); H01L 51/0022 (2013.01);
(Continued)

(58) Field of Classification Search
CPC .......................... H01L 51/5228; H01L 51/525
See application file for complete search history.

(56) References Cited

U.S. PATENT DOCUMENTS

2010/0258346 A1   10/2010   Chen et al.
2015/0021571 A1   1/2015   Yamakita
(Continued)

FOREIGN PATENT DOCUMENTS

CN   1382007 A    11/2002
CN   102352495 A   2/2012
(Continued)

OTHER PUBLICATIONS

First Office Action for Chinese Application No. 201810502101.7, dated Jun. 21, 2019, 10 Pages.
(Continued)

*Primary Examiner* — Daniel P Shook
(74) *Attorney, Agent, or Firm* — Brooks Kushman P.C.

(57) ABSTRACT

The present disclosure provides a display device and a method for preparing the same. The display device includes a first base; a transparent electrode arranged on the first base; a display substrate arranged on a side of the first base proximate to the transparent electrode and opposite to the first base, the display substrate comprising a cathode located on a side of the display substrate proximate to the first base; and a supporting body located between the transparent
(Continued)

electrode and the cathode and configured to electrically conduct the transparent electrode and the cathode.

19 Claims, 5 Drawing Sheets

(51) Int. Cl.
  *H01L 51/00* (2006.01)
  *H01L 51/56* (2006.01)
(52) U.S. Cl.
  CPC ...... *H01L 51/5218* (2013.01); *H01L 51/5234* (2013.01); *H01L 51/5246* (2013.01); *H01L 51/5259* (2013.01); *H01L 51/56* (2013.01); *H01L 2251/5315* (2013.01)

(56) References Cited

U.S. PATENT DOCUMENTS

| | | |
|---|---|---|
| 2016/0233458 A1 | 8/2016 | Shen et al. |
| 2018/0175318 A1 | 6/2018 | Xu et al. |
| 2019/0173047 A1* | 6/2019 | Sun .................... H01L 51/5234 |

FOREIGN PATENT DOCUMENTS

| | | |
|---|---|---|
| CN | 103715231 A | 4/2014 |
| CN | 104299980 A | 1/2015 |
| CN | 105826357 A | 8/2016 |
| CN | 106803547 A | 6/2017 |
| CN | 107579168 A | 1/2018 |
| CN | 108711592 A | 10/2018 |
| JP | H1154285 A | 2/1999 |
| TW | 201037799 A | 10/2010 |

OTHER PUBLICATIONS

International Search Report and Written Opinion for Application No. PCT/CN2019/085124, dated Aug. 5, 2019, 9 Pages.

Zhang et al., "Progress in Research on Reliability of Anisotropic Conductive Adhesives," Electric Components & Materials, Jan. 2004, pp. 35-38, vol. 23, Iss. No. 1 (4 pages total).

* cited by examiner

DISPLAY DEVICE AND METHOD FOR PREPARING THE SAME

CROSS-REFERENCE TO RELATED APPLICATIONS

This application is the U.S. national phase of PCT Application No. PCT/CN2019/085124 filed on Apr. 30, 2019, which claims priority to Chinese Patent Application No. 201810502101.7 filed on May 23, 2018, which are incorporated herein by reference in their entireties.

TECHNICAL FIELD

The present disclosure relates to the field of display technology, in particular to a display device and a method for preparing the same.

BACKGROUND

At present, organic light-emitting diode (OLED) has been widely used in large-size OLED displays to achieve mass production. The light emitted by the top emission type OLED does not need to pass through the pixel circuit region, which is advantageous for improving the aperture ratio of the display, and has the advantages of high luminous efficiency, low power consumption and the like. Moreover, the top emission type OLED display can utilize the microcavity effect, and can significantly improve the luminous efficiency and color purity by the optimized design of the microcavity structure, thereby improving the overall image quality of the OLED display.

SUMMARY

An embodiment of the present disclosure provide a display device, including a first base; a transparent electrode arranged on the first base; a display substrate arranged on a side of the first base proximate to the transparent electrode and opposite to the first base, the display substrate comprising a cathode located on a side of the display substrate proximate to the first base; and a supporting body located between the transparent electrode and the cathode and configured to electrically conduct the transparent electrode and the cathode.

In one example, the supporting body includes monodisperse particles and a conductive layer wrapping the monodisperse particles, the transparent electrode and the cathode being electrically conducted through the conductive layer.

In one example, the supporting body includes a moisture absorbing layer arranged at a periphery of the monodisperse particles, the moisture absorbing layer being configured to prevent external moisture from entering the display device.

In one example, the supporting body includes monodisperse particles, the first base has a plurality of groove structures surrounding the monodisperse particles, and the monodisperse particles are arranged within the plurality of groove structures in one-to-one correspondence manner.

In one example, the display device further includes a plurality of metal blocks, an orthogonal projection of the plurality of metal blocks on the first base falls within an orthogonal projection of the transparent electrode on the first base, and the plurality of groove structure penetrates the transparent electrode in a direction perpendicular to the first base and extends into the plurality of metal blocks.

In one example, a surface of the monodisperse particles is sequentially wrapped with a conductive layer and a moisture absorbing layer, and the groove structure surrounds the monodisperse particles having a surface sequentially wrapped with the conductive layer and the moisture absorbing layer.

In one example, the monodisperse particles having a surface wrapped with the moisture absorbing are arranged in the groove structures in one-to-one correspondence manner, the conductive layer is arranged on a side of the monodisperse particles having a surface wrapped with the moisture absorbing layer away from the first base and covers the monodisperse particles, and the conductive layer and the transparent electrode are integrated.

In one example, a material of the monodisperse particles is polystyrene, polyacrylate, silica or titania.

In one example, a material of the moisture absorbing layer is a hygroscopic polymer selected from one or more of acrylonitrile, acrylamide, and polyvinyl alcohol, or a resin material doped with hygroscopic particles selected from one or more of $SiO_2$, $TiO_2$, CaO, and BaO.

In one example, the supporting body is arranged in contact with a surface of the transparent electrode facing away from the first base and conductive in a direction perpendicular to the first base, and a material for preparing the supporting body includes a hygroscopic material.

In one example, the first base includes a display region and a non-display region located at a periphery of the display region, the non-display region includes a first sealing region, a side of the first sealing region proximate to a center of the first base is provided with a plurality of supporting bodies, the plurality of supporting bodies is arranged around a periphery of the display region.

In one example, the plurality of supporting bodies is arranged at equal intervals around a display panel region.

Optionally, the display region includes a plurality of sub-pixel regions, and each of the plurality of supporting bodies is arranged between at least a portion of two adjacent sub-pixel regions.

For example, the supporting body is arranged between every two adjacent pixel regions.

Further, the first base further includes a second sealing region, the second sealing region is located between the first sealing region and the display region, and the second sealing region is provided with the supporting body.

Further, the display device further includes an overcoat arranged on the base, and the groove structure is arranged on a surface of the overcoat.

Further, the display substrate further includes an anode located on a side of the cathode away from the first base and a light-emitting layer located between the anode and the cathode, the cathode being a plate-shaped electrode covering the entire display substrate.

In one example, an orthogonal projection of the cathode on the first base overlaps an orthogonal projection of the transparent electrode on the first base.

An embodiment of present disclosure further provides a method for preparing the display device as described above, including: providing a first base; forming a first transparent electrode on the base; preparing a display substrate arranged opposite to the first base, the display substrate including a cathode located on a side of the display substrate proximate to the first base; and forming a supporting body located between the transparent electrode and the cathode and configured to electrically conduct the transparent electrode and the cathode.

Further, the method further includes: forming an anode of the display substrate, the anode being located on a side of the cathode away from the first base; and forming a light-emitting layer located between the anode and the cathode, the cathode being a plate-shaped electrode covering the entire display substrate.

BRIEF DESCRIPTION OF THE DRAWINGS

Since the light emitted by the top emission type OLED is emitted from the top and must pass through the cathode of the OLED, the cathode must be made thin enough to meet the requirements of the OLED display for the light transmittance. Generally, the cathode of the top emission type OLED device has a thickness of 10 to 20 nm, and the square resistance of the cathode is relatively large at such a thickness. The voltage signal applied to the cathode causes a significant voltage drop (IR Drop) during transmission, especially for large-sized OLED displays, whose image quality is poor. In order to solve the above problem, the related art designs an auxiliary cathode on the encapsulation cover plate, and uses a high conductive ITO layer to be electrically connected to the cathode, so as to reduce the IR Drop phenomenon.

The light of the top emission type OLED display is emitted from a side of the encapsulation structure, so the encapsulation structure must adopt a transparent structure. The related art mainly relies on an inorganic encapsulation layer to ensure the encapsulation performance of the OLED display.

However, the auxiliary cathode in the related art is prepared on the encapsulation cover plate. If an inorganic encapsulation layer is formed on the cathode surface of the OLED, the auxiliary cathode is separated from the cathode and cannot be electrically connected. In order to ensure effective electrical connection between the auxiliary cathode and the cathode, the inorganic encapsulation layer can only be abandoned, which greatly affects the encapsulation effect.

In order to illustrate the technical solutions of the present disclosure or the related art in a clearer manner, the drawings required for the present disclosure or the related art will be briefly described hereinafter. Obviously, the following drawings merely relate to some embodiments of the present disclosure. Based on these drawings, a person skilled in the art may obtain the other drawings without any creative work.

DETAILED DESCRIPTION

Since the light emitted by the top emission type OLED is emitted from the top and must pass through the cathode of the OLED, the cathode must be made thin enough to meet the light transmittance requirements of the OLED display. Generally, the top emission type OLED device has a cathode thickness of 10 to 20 nm, and the cathode resistance of the cathode is relatively large at such a thickness. The voltage signal applied to the cathode causes a significant voltage drop (IR Drop) during transmission, especially for large-sized OLED displays, whose picture quality is poor. In order to solve the above problem, the related art designs an auxiliary cathode on the package cover plate, and uses a highly conductive ITO layer to be electrically connected to the cathode, so as to reduce the IR Drop phenomenon.

The light of the top emission type OLED display is emitted from a side of the package structure, so the package structure must adopt a transparent structure. The related technology mainly relies on an inorganic packaging layer to ensure the packaging performance of the OLED display.

However, the auxiliary cathode in the related art is prepared on the package cover plate. If an inorganic packaging layer is formed on the cathode surface of the OLED, the auxiliary cathode is separated from the cathode and cannot be turned on. In order to ensure effective conduction between the auxiliary cathode and the cathode, the inorganic packaging layer can only be abandoned, which greatly affects the packaging effect.

The structure of the top emission type OLED display is shown as follows. The pixel defining layer defines a plurality of pixel regions, and the anode and the light-emitting layer of the OLED are formed in each pixel region, and the cathode of the OLED in all pixel regions is an integrated structure, thereby forming a plate-shaped electrode covering the entire display region.

The related art mainly uses a Dam & Filler encapsulation structure to implement a encapsulation of the top emission type OLED display, in which the Dam & Filler encapsulation structure includes an inorganic encapsulation layer for covering the surface of the cathode layer, a circle of UV-curable adhesive surrounding the AA outside the AA region, a cover plate bonded by a UV-curable adhesive and the OLED display, and a filling adhesive filling a space region between the inorganic encapsulation layer and the cover plate. In the Dam & Filler encapsulation structure, the UV-curable adhesive, filling adhesive and inorganic encapsulation layer constitute a three-stage barrier system, in which the UV-curable adhesive and the filling adhesive have a water vapor barrier capacity of the order of 10 to 100 $g/(m^2 \cdot day)$, and the inorganic encapsulation layer has a water vapor barrier capability of the order of $10^{-4}$ to $10^{-5}$ $g/(m^2 \cdot day)$. Therefore, the inorganic encapsulation layer mainly ensures the encapsulation performance of the OLED display.

For the OLED display substrate, the inorganic encapsulation layer can effectively block water and oxygen, thereby ensuring the performance of the display. If the inorganic encapsulation layer is omitted, the encapsulation effect of the OLED display will be greatly affected, and the intrusion of the water and oxygen will affect the lifetime of the OLED and even cause the OLED out of action. For example, a transparent electrode is formed on the encapsulation cover plate, and connected in parallel with the cathode on the OLED display substrate to reduce the transmission resistance of the cathode, reduce IR Drop, and improve display quality. In order to achieve electrical connection between the transparent electrode and the cathode, it is impossible to form an inorganic encapsulation layer for covering the cathode. Of course, the technical solution of the present disclosure is also applicable to other situations where the inorganic encapsulation layer needs to be omitted.

The purpose of the present disclosure is to provide an OLED display device, including an OLED display substrate and an encapsulation structure for encapsulating an OLED display substrate, which can ensure the encapsulation effect, effectively block water and oxygen to ensure the performance of the display, even if the inorganic encapsulation layer is omitted.

The encapsulation structure includes a first base and a transparent electrode arranged on the first base. The first base includes a display region and a non-display region located at a periphery of the display region. The display region includes a plurality of pixel regions. The non-display region includes a first sealing region. After the OLED display substrate and the encapsulation structure are oppositely arranged to form a cell, the first sealing region has a sealing structure for blocking water vapor.

A side of the first sealing region proximate to a center of the first base is provided with a plurality of supporting bodies, the plurality of supporting bodies are arranged around a periphery of the display region, the transparent electrode is electrically connected to the plurality of supporting bodies, the supporting body is electrically conductive in a direction perpendicular to the first base, and a material for preparing the supporting body is a hygroscopic material for absorbing water vapor.

The above described encapsulation structure first blocks water vapor at the periphery of the display region, and then absorbs water vapor, thereby forming two barriers. Even if the inorganic encapsulation layer for covering the cathode is omitted, it is also capable of effectively blocking water vapor from entering the display region, and preventing the intrusion of water and oxygen from affecting the performance of the OLED. The supporting body for absorbing water vapor also has a conductive capability, and is used for electrically connecting the transparent electrode and the cathode after the encapsulation structure and the OLED display substrate are oppositely arranged to form a cell to reduce the resistance of the cathode, reduce the IR Drop, and thereby improving the display quality. In addition, the supporting body also has the barrier property of absorbing water and oxygen and the conductive property, and is also advantageous for reducing the frame of the display to realize a narrow bezel.

Optionally, the supporting body may be arranged in the display region between the two adjacent sub-pixel regions, and the supporting body is arranged between at least a portion of adjacent two sub-pixel regions. Since the absorption process of water vapor absorption by the moisture absorbing material is physical adsorption, it will be much faster than the chemical corrosion process of the water vapor to the OLED, so the water vapor will be preferentially adsorbed by the moisture absorbing material, and thereby effectively blocking the water vapor from corroding the OLED. At the same time, the supporting body also has the effect of supporting the thickness of the panel.

Optionally, the supporting body is arranged between every two adjacent sub-pixel regions to improve the barrier effect and ensure that each OLED does not have the risk of being corroded by water vapor.

Further, the supporting body may be arranged on the outer side of each side of each sub-pixel region and the position of the corresponding vertex to further improve the barrier effect.

In an example of the present disclosure, the first base further includes a second sealing region located between the first sealing region and the display region, in which the second sealing region is provided with a plurality of supporting bodies, and the plurality of supporting bodies are arranged around the periphery of the display region, absorb water vapor at the periphery of the display region, block water vapor from entering the display region to prevent water vapor from corroding the OLED.

The plurality of supporting bodies may be arranged at equal intervals around the display region to improve the barrier effect.

In the present disclosure, the supporting body may be arranged only between at least a portion of two adjacent sub-pixel regions, or the supporting body may be arranged only in the second sealing region. Of course, the supporting body may also be arranged between at least a portion of two adjacent sub-pixel regions and in the second sealing region at the same time, in which the specific arrangement is the same as the above, and details are not described herein again.

Optionally, the supporting body is arranged between at least a portion of two adjacent sub-pixel regions and in the second sealing region at the same time. Since there is a gas passage between the supporting body and the display region of the second sealing region, according to the concentration diffusion principle of gas, the water vapor can diffuse along the passage to the display region. The supporting body of the display region can adsorb the water vapor again to maintain a water vapor content in the vicinity of OLED at a very low level, which is insufficient to react with the OLED, thereby effectively preventing the OLED from being corroded by water vapor, affecting the lifetime of the OLED, and even causing device out of action.

In one example, the encapsulation structure and the OLED display substrate are oppositely arranged to form a cell, and the supporting body is located between the first base of the encapsulation structure and the OLED display substrate.

The OLED display substrate includes a plurality of OLEDs including an anode, a cathode, and a light-emitting layer located between the anode and the cathode. The cathode is located on a side of the light-emitting layer proximate to the encapsulation structure. The cathode is a plate-shaped electrode for covering the entire OLED display substrate, and is electrically connected to the transparent electrode through the supporting body.

In the above display device, the cathode of the top emission type OLED display substrate and the transparent electrode of the encapsulation structure are connected in parallel through the supporting body, thereby reducing the resistance of the cathode, reducing the IR Drop, and improving the display quality. Moreover, it blocks water vapor at the periphery of the display region, and then absorbs water vapor, thereby forming two barriers. Even if the inorganic encapsulation layer for covering the cathode is omitted, it is also capable of effectively blocking water vapor from entering the display region, and preventing the intrusion of water and oxygen from affecting the performance of the OLED. In addition, the supporting body also has the barrier property of absorbing water and oxygen and the conductive property, and is also advantageous for reducing the frame of the display to realize a narrow bezel.

Optionally, the first sealing region on the periphery of the display region forms a sealing structure for blocking water vapor, and the sealing structure may be a sealant, such as glass glue or UV-curable glue.

The moisture absorbing material may be selected from one or more of acrylonitriles, acrylamides and polyvinyl alcohols, or a resin material doped with one or more of $SiO_2$, $TiO_2$, $CaO$, and $BaO$.

In the present disclosure, the supporting body includes a monodisperse particle, the first base has a plurality of groove structures being matched with the monodisperse particle, and the monodisperse particle is arranged within the corresponding groove structure. The supporting body further includes a conductive layer and a moisture absorbing layer arranged on a periphery of the monodisperse particle, in which the conductive layer is used to make the supporting body conductive in a direction perpendicular to the first base.

The above technical solution forms a substrate of the supporting body by monodisperse particles, and fits the monodisperse particles in the groove structure. When the OLED display substrate and the encapsulation structure are oppositely arranged to form a cell, the position of the monodisperse particles can be fixed, and be also capable of achieving the effect of supporting the cell thickness of the panel.

The monodisperse particle refers to a particle having the same shape and a very uniform size. The monodisperse particle has a particle size of the order of micrometer, and the monodisperse particle can be placed in a one-to-one corresponding groove by a dispenser or an ink jet device. A material of the monodisperse particle may be a resin material such as polystyrenes or polyacrylates, or may be an inorganic oxide material such as silica or titania.

In a specific embodiment, a surface of the monodisperse particle is sequentially wrapped with a conductive layer and a moisture absorbing layer, and the groove structure is matched with monodisperse particle whose surface is sequentially wrapped with a conductive layer and a moisture absorbing layer. The supporting body is a sphere having conductive and hygroscopic properties. When the OLED display substrate and the encapsulation structure are oppositely arranged to form a cell, the moisture absorbing layer of the upper surface and the lower surface of the supporting body is crushed under pressure in a direction perpendicular to a plane at which the first base of the encapsulation structure is located, so that the upper surface and the lower surface of the moisture absorbing layer each have a notch to expose the conductive layer, such that the supporting body is electrically conductive in a direction perpendicular to the first base for electrically connecting the cathode of the OLED and the transparent electrode on the encapsulation structure.

The related art provides a method for preparing a monodisperse and high-performance conductive gold ball, in which a conductive layer is wrapped on the surface of the monodisperse particles to form a conductive gold ball, and then a moisture absorbing layer is wrapped on the surface of the conductive gold ball. A conductive gold ball can be formed by wrapping a conductive material on the outer layer of the monodisperse particles.

The moisture absorbing layer may be a crushable resin material, and a hygroscopic material may be added to the resin material, e.g., a resin material is doped with one or more of $SiO_2$, $TiO_2$, CaO, and BaO.

Optionally, the supporting body may be placed in contact with a surface of the transparent electrode facing away from the first base. Since the thickness of the transparent electrode is very thin, in order to arrange the groove structure, the encapsulation structure is further provided with a plurality of metal blocks, and the transparent electrode covers the metal block. The groove structure penetrates the transparent electrode in a direction perpendicular to the first base and extends into the metal block. In addition, the arrangement of the metal block can also reduce the electrical resistance of the transparent electrode, and further reducing the electrical resistance of the cathode of the OLED.

The above supporting body is a sphere, in which a conductive layer and a moisture absorbing layer are sequentially wrapped on the surface of the monodisperse particle. However, the structure of the supporting body having both electrical conductivity and water vapor absorption properties is not limited to this structure.

In another embodiment, the supporting body includes a monodisperse particle, whose surface is wrapped with a moisture absorbing layer. A conductive layer is arranged on a side of the monodisperse particle having a surface wrapped with a moisture absorbing layer away from the first base, and the conductive layer covers the monodisperse particle. The conductive layer may be formed integrally with the transparent electrode. When the OLED display substrate and the encapsulation structure are oppositely arranged to form a cell, the transparent electrode is in direct electrical contact with the cathode of the OLED.

The supporting body includes a sphere having a surface wrapped with a moisture absorbing layer, and a conductive layer for covering a side of the sphere. The sphere having a surface wrapped with the moisture absorbing layer can be placed in a one-to-one corresponding groove structure by a dispenser or an ink jet device. The groove structure is matched with the monodisperse particle having the surface wrapped with the moisture absorbing layer.

The material of the monodisperse particle may be a resin material such as polystyrenes or polyacrylates, or may be an inorganic oxide material such as silica or titania. The material of the moisture absorbing layer may be a hygroscopic polymer (one or more of acrylonitriles, acrylamides, polyvinyl alcohols) or a resin material doped with hygroscopic particle (one or more of $SiO_2$, $TiO_2$, CaO, BaO).

In order to be arrange the groove structure, an overcoat is provided on the first base, and the groove structure is provided on the surface of the overcoat.

Of course, the supporting material of the present disclosure is also not limited to the above two structures. For example, the supporting body may further include a substrate made of an anisotropic conductive adhesive, which electrically connects the cathode of the OLED and the transparent electrode of the encapsulation structure in a direction perpendicular to the first base, and a moisture absorbing layer is formed on a side of the first base.

The advantageous effects of the above technical solutions of the present disclosure are shown as follows.

In the above technical solution, by forming a supporting body having conductivity and moisture absorbing property on a side of the sealing region proximate to the center of the encapsulation structure, it is possible to block water vapor at the periphery of the display region, and then absorbs water vapor, thereby forming two barriers. Even if the inorganic encapsulation layer for covering the cathode is omitted, it is also capable of effectively blocking water vapor from entering the display region, and preventing the intrusion of water and oxygen from affecting the performance of the OLED. The supporting body is also used for electrically connecting the transparent electrode and the cathode after the encapsulation structure and the OLED display substrate are oppositely arranged to form a cell to reduce the resistance of the cathode, reduce the IR Drop to improve the display quality. In addition, the supporting body also has the barrier property of absorbing water and oxygen and the conductive property, and is also advantageous for reducing the frame of the display device to realize a narrow bezel.

The present disclosure provides a method for preparing a device as described above, including a method for preparing an encapsulation structure and a method for preparing an OLED display substrate, in which the method for preparing the package structure includes: providing a first base, the first base including a display region and a non-display region located at a periphery of the display region, and the non-display region including a first sealing region; forming a transparent electrode on the first base; forming a plurality of supporting bodies on a side of the first sealing region proximate to the center of the first base, the transparent electrodes being electrically connected to the plurality of supporting bodies, the plurality of supporting bodies is electrically conductive in a direction perpendicular to the first base, and a material for preparing the plurality of supporting bodies includes a hygroscopic material for absorbing water vapor.

In the display device produced by the above preparing method, after the OLED display substrate and the encapsulation structure are oppositely arranged to form the cell, the first sealing region has a sealing structure for blocking water vapor, and the sealing structure can block water vapor at the periphery of the display region, and then absorb water vapor, thereby forming two barriers. Even if the inorganic encapsulation layer for covering the cathode is omitted, it is also capable of effectively blocking water vapor from entering the display region, and preventing the intrusion of water and oxygen from affecting the performance of the OLED. Optionally, the supporting body for absorbing water vapor also has a conductive capability, and is used for electrically connecting the transparent electrode and the cathode after the encapsulation structure and the OLED display substrate are oppositely arranged to form a cell to reduce the resistance of the cathode, reduce the IR Drop to improve the display quality. In addition, the supporting body also has the barrier property of absorbing water and oxygen and the conductive property, and is also advantageous for reducing the frame of the display device to realize a narrow bezel.

The display device may be an OLED display panel, an electronic paper, a mobile phone, a tablet computer, a television, a display, a notebook computer, a digital photo frame, a navigator, or any product or component having a display function.

The detailed description of the present disclosure will be further described in detail below with reference to the drawings and examples. The following examples are used to illustrate the disclosure, but are not intended to limit the scope of the disclosure.

Figure 1:
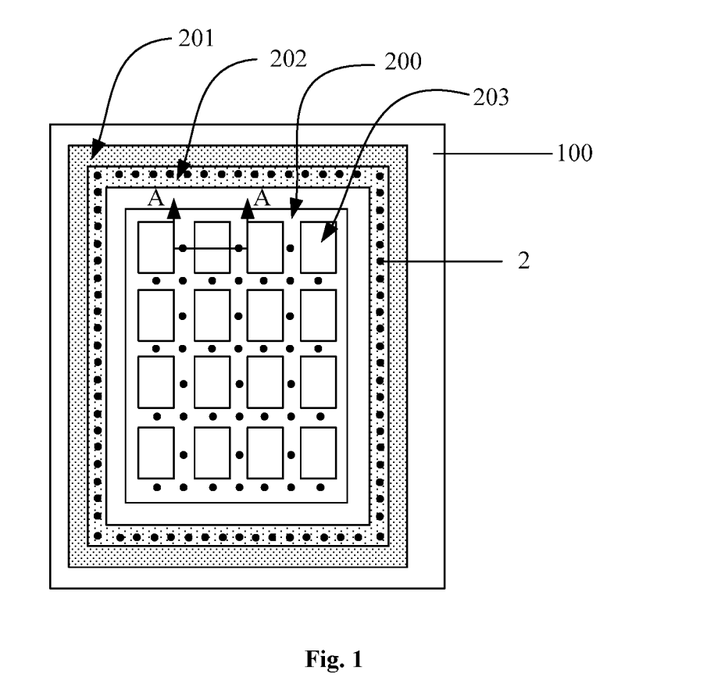
FIG. 1 is a schematic view showing a display device according to an embodiment of the present disclosure.
Figure 2:
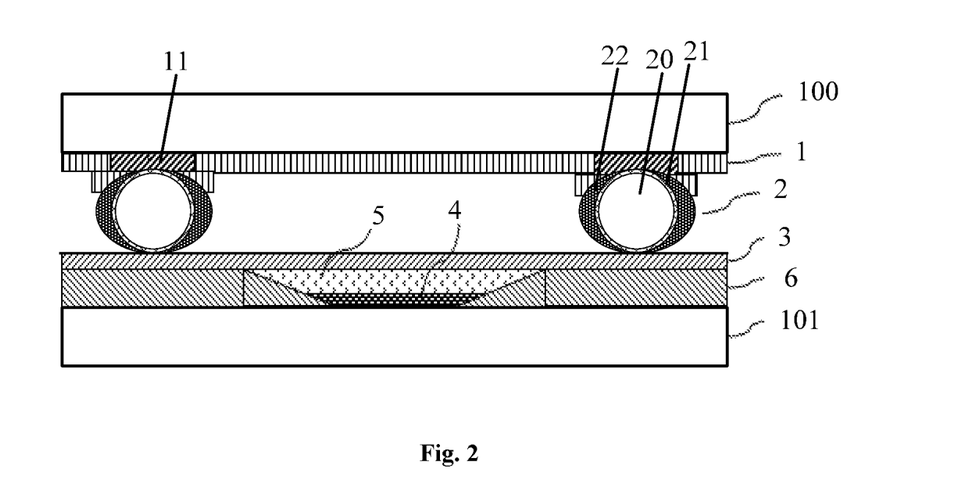
FIG. 2 is one partial cross-sectional view of FIG. 1 along line A-A.

As shown in FIG. 1 and FIG. 2, the OLED display device in this embodiment includes an OLED display substrate and a encapsulation structure that are oppositely arranged to form a cell.

The encapsulation structure includes a first base 100 and a transparent electrode 1 arranged on the first base 100. The first base 100 includes a display region 200 and a non-display region located at the periphery of the display region 200. The display region 200 includes a plurality of sub-pixel regions 203, each of the plurality of sub-pixel regions 203 includes a color filter layer for improving the quality of the displaying picture. At least one supporting body 2 is arranged between every adjacent sub-pixel regions 203 (including adjacent sides and adjacent vertices), and FIG. 1 only shows one supporting body. The non-display region includes a first sealing region 201 and a second sealing region 202 between the display region 200 and the first sealing region 201. The second sealing region 202 is provided with a plurality of supporting bodies 2, and the plurality of supporting bodies 2 are arranged around the periphery of the display region 200. The transparent electrode 1 is electrically connected to the plurality of supporting bodies 2. The plurality of supporting bodies 2 are electrically conductive in a direction perpendicular to the first base 100, and a material for preparing the plurality of supporting bodies 2 includes a hygroscopic material for absorbing water vapor.

The material of the transparent electrode 1 may be a metal oxide such as one or more of indium zinc oxide, indium tin oxide, indium gallium tin oxide and indium oxide, or a conductive polymer such as one or more of polyanilines, polypyrroles, polythiophenes and polyacetylenes.

The OLED display substrate includes a second base 101 and a pixel defining layer 6 arranged on the second base 101. The pixel defining layer 6 is configured to define a plurality of sub-pixel regions. Each of the sub-pixel regions includes an OLED, and the OLED includes a cathode 3, an anode 4, and an organic light-emitting layer 5 located between the cathode 3 and the anode 4. The cathode 3 is located on the side of the organic light-emitting layer 5 facing away from the anode 4, and is a plate-shaped electrode covering the entire display region. The cathode 3 is made of a transparent conductive material (such as indium tin oxide, indium zinc oxide, etc.), and the anode 4 is made of a reflective conductive material (which may be a high reflectivity metal such as Ag, Al; or a composite film of a transparent conductive compound and a high reflectivity metal, such as Ag/ITO, Al/ITO), and the light emitted from the organic light-emitting layer 5 is transmitted through the cathode 3 and emitted from the top of the OLED.

A UV-curable adhesive is arranged in the first sealing region 201 for blocking water vapor. The OLED display substrate and the encapsulation structure are oppositely arranged to form a cell, and the UV-curable adhesive is irradiated with ultraviolet rays to complete the fixed cell alignment.

After the OLED display substrate and the encapsulation structure are oppositely arranged to form a cell, the transparent electrode 1 and the cathode 3 are connected in parallel by a plurality of supporting bodies 2.

The above definition of the first base and the second base is used for the sake of distinction only, and has no other limiting meaning.

In the above top emission type OLED display device, the cathode of the OLED display substrate and the transparent electrode of the encapsulation structure are connected in parallel through the supporting body, thereby reducing the resistance of the cathode, reducing the IR Drop, and improving the display quality. After the encapsulation structure and the OLED display substrate are oppositely arranged to form a cell, the sealant of the first sealing region can block the water vapor and form a first layer of the barrier, the supporting body of the second sealing region can absorb the water vapor and form the second layer of the barrier, and the supporting body of the display region can further absorb water vapor and form a third layer of barrier. The three-layer barrier can maintain a water vapor content in the vicinity of OLED at a very low level, which is insufficient to react with the OLED, thereby effectively preventing the OLED from being corroded by water vapor, affecting the lifetime of the OLED, and even causing device out of action. In addition, the supporting body also has the barrier property of absorbing water and oxygen and the conductive property, and is also advantageous for reducing the frame of the display to realize a narrow bezel.

The supporting body 2 includes monodisperse particles 20, the first base 100 has a plurality of groove structures 10 which are matched with the monodisperse particles 20, and the monodisperse particles 20 are arranged in the groove structures 10 in one-to-one corresponding manner. After the OLED display substrate and the encapsulation structure are oppositely arranged to form a cell, the groove structures 10 fix the positions of the monodisperse particles 20. The supporting body 2 further includes a conductive layer 21 and a moisture absorbing layer 22 which are arranged at a periphery of the monodisperse particles 20, in which the conductive layer 21 is used to make the supporting body 2 conductive in a direction perpendicular to the first base 100.

The above technical solution forms a substrate of the supporting body by monodisperse particles, and fits the monodisperse particles in the groove structure. When the OLED display substrate and the encapsulation structure are oppositely arranged to form a cell, the position of the monodisperse particles can be fixed, and be also capable of achieving the effect of supporting the cell thickness of the panel.

In a specific embodiment, as shown in FIG. 1 and FIG. 2, a plurality of metal blocks 11 are arranged on the first base 100, and the transparent electrode 1 covers the plurality of metal blocks 11. The groove structure 10 penetrates the transparent electrode 1 in a direction perpendicular to the first base 100 and extends into the metal block 11. The arrangement of the metal block 11 can reduce the electric resistance of the transparent electrode 1, and further reduce the electric resistance of the cathode 3 of the OLED. The supporting body 2 includes monodisperse particles 20, and a conductive layer 21 and a moisture absorbing layer 22 which are sequentially wrapped on the surface of the monodisperse particles 20. The groove structure 10 is matched with the monodisperse particle 20 whose surface is sequentially wrapped with the conductive layer 21 and the moisture absorbing layer 22, and the supporting body 2 is placed in a one-to-one corresponding groove structure 10 by a dispenser or an ink jet device.

When the OLED display substrate and the encapsulation structure are oppositely arranged to form a cell, the moisture absorbing layer 22 of the upper surface and the lower surface of the supporting body 2 is crushed under pressure in a direction perpendicular to the first base 100, so that the upper surface and the lower surface of the moisture absorbing layer 22 each have a notch to expose the conductive layer 21, such that the supporting body 2 is electrically conductive in a direction perpendicular to the first base 100, for electrically connecting the cathode 3 of the OLED and the transparent electrode 1 on the encapsulation structure.

Figure 4:
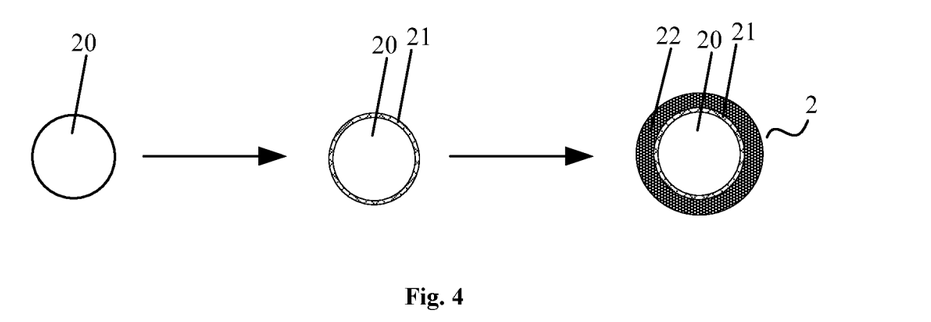
FIG. 4 is a schematic view showing a process of manufacturing a supporting body according to an embodiment of the present disclosure.

Illustratively, the method for preparing the supporting body 2 is shown as follow: first the conductive layer 21 is wrapped on the surface of the monodisperse particles 20, and then the moisture absorbing layer 22 is wrapped on the surface of the conductive layer 21, as shown in FIG. 4.

The moisture absorbing layer 22 is made of a crushable resin material, and a hygroscopic material may be added to the resin material, e.g., a resin material is doped with one or more of $SiO_2$, $TiO_2$, CaO, and BaO.

The material of the metal block 11 may be one or more of Cu, Nd, Mo, Al, and Ti.

Figure 5:
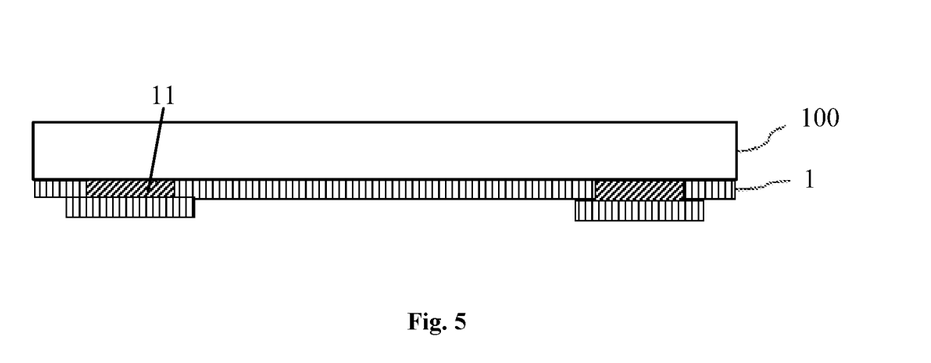
FIGS. 5 to 7 are schematic views showing a process of manufacturing the display device according to an embodiment of the present disclosure.
Figure 6:
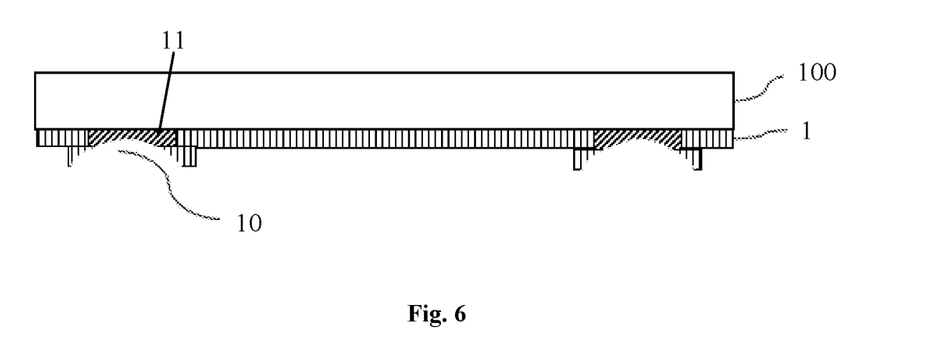
Figure 7:
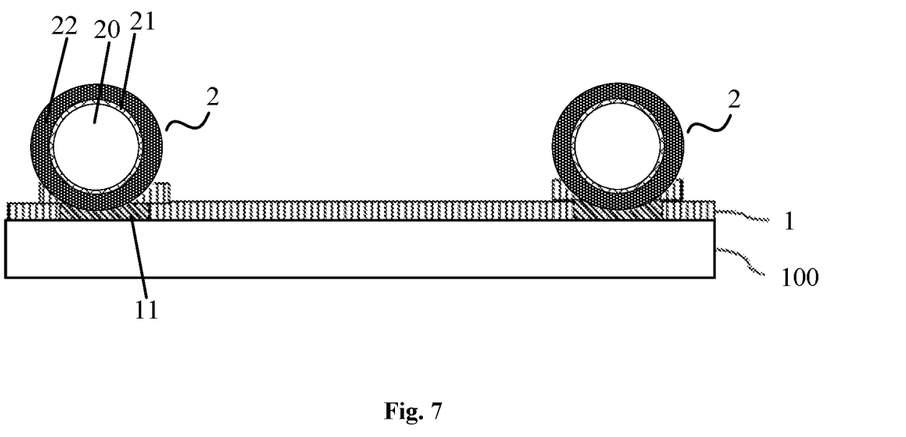

In this embodiment, the method for preparing the encapsulation structure further includes: forming a color filter layer (not shown) in each sub-pixel region of the display region of the first base; forming an overcoat (not shown) for covering the color filter layer; forming a metal thin film on the overcoat by a film forming process such as a physical vapor deposition method or a sputtering process, and patterning the metal thin film to form a plurality of metal blocks 11, as shown in FIG. 5; forming a transparent electrode 1 for covering the plurality of metal blocks 11, as shown in FIG. 5; forming a plurality of groove structures 10, in a direction perpendicular to the first base 100, the groove structure 10 penetrates the transparent electrode 1 and extends into the metal block 11, in which the groove structure 10 is located in the second sealing region 202 and between two adjacent sub-pixel regions, as shown in FIG. 1 and FIG. 6; placing the supporting body 2 in each groove structure 10 by a dispenser, in which the supporting body 2 is a monodisperse particle 20 whose surface is sequentially wrapped with the conductive layer 21 and the moisture absorbing layer 22, as shown in FIG. 7; and applying the UV-curable adhesive to the first sealing region 201, as shown in FIG. 1.

So far, the production of the encapsulation structure is completed.

Referring to FIG. 2, the method for preparing OLED display substrate is shown as follows: sequentially forming a thin film transistor (not shown), an overcoat and a pixel defining layer 6 on the second base 101 (which may be a glass base, a metal film or a resin base), in which the pixel defining layer 6 defines a plurality of pixel regions; sequentially forming an anode 4 (which may be a high reflectivity metal such as Ag, Al), an organic light-emitting layer and a transflective cathode 3 (such as Mg:Ag) or a transparent cathode 3 (such as IZO) of the OLED in each pixel region 5, in which the cathode 3 is a plate-shaped electrode for covering the entire display region.

After the preparation of the OLED display substrate and the encapsulation structure is completed, a cell alignment is performed, the pressure in the process of the box crushes the moisture absorbing layer 22 on the upper surface and the lower surface of the supporting body 2 to expose the conductive layer 21, and the conductive layer 21 is electrically connected to the transparent electrode 1 and the cathode 3 to realize the parallel connection of the transparent electrode 1 and the cathode 3, as shown in FIG. 2. Then, it is irradiated by ultraviolet light, so that the UV-curable adhesive is cured. The cured UV-curable adhesive and the supporting body 2 form three layers of barriers to first block the water vapor and then to absorb the water vapor, thereby ensuring the encapsulation effect.

Figure 3:
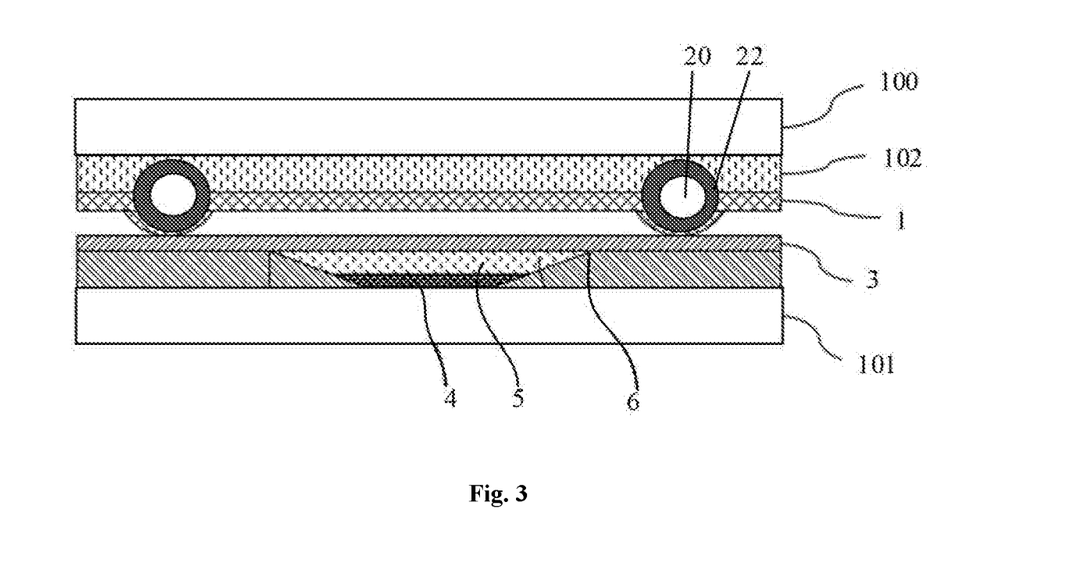
FIG. 3 is another partial cross-sectional view of FIG. 1 along line A-A.

In another embodiment, an overcoat 102 is formed on the first base 100, and the groove structure 10 is arranged on the surface of the overcoat 102. The supporting body 2 includes monodisperse particles 20, whose surface is wrapped with a moisture absorbing layer 22. The groove structure 10 is matched with the monodisperse particles 20 whose surface is wrapped with the moisture absorbing layer 22, and the monodisperse particles 20 whose surface is wrapped with the moisture absorbing layer 22 is placed into a one-to-one corresponding groove structures 10 by a dispenser or an ink jet device. The supporting body 2 further includes a conductive layer for covering the monodisperse particles 20 whose surface is wrapped with the moisture absorbing layer 22, and the conductive layer and the transparent electrode 1 are an integrated structure.

After the OLED display substrate and the encapsulation structure are oppositely arranged to form a cell, the transparent electrode 1 is in direct electrical contact with the cathode 3 of the OLED at a position corresponding to the monodisperse particles 20.

Figure 8:
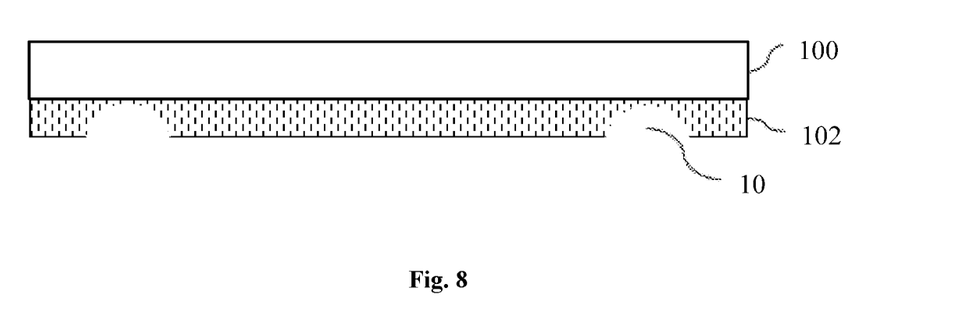
FIGS. 8 and 9 are schematic views showing a process of manufacturing the display device according to another embodiment of the present disclosure.
Figure 9:
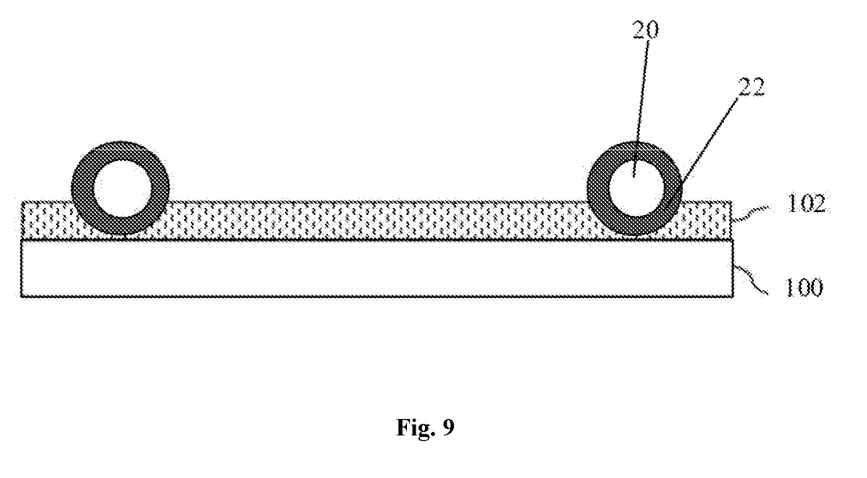

In this embodiment, the method for preparing the encapsulation structure specifically includes: forming a color filter layer (not shown) in each sub-pixel region of the display region of the first base; forming an overcoat 102 for covering the color filter layer, as shown in FIG. 8; forming a groove structure 10 on the surface of the overcoat 102, in which the groove structure 10 is located between the second sealing region 202 and the two adjacent sub-pixel regions, as shown in FIG. 1 and FIG. 8; placing the monodisperse particles 20 whose surface is wrapped with the moisture absorbing layer 22 in each groove structure 10 by a dispenser, as shown in FIG. 9; forming a transparent electrode 1 on the overcoat 102 by one or more of a dispenser, a spin coating, an inkjet printing or a transfer process, in which the transparent electrode 1 covers the surface of the overcoat 102 and the monodisperse particles 20 whose surface is wrapped with the moisture absorbing layer 22, and the material of the transparent electrode 1 may be one or more of polyanilines, polypyrroles, polythiophenes, and polyacetylenes; and applying the UV-curable adhesive to the first sealing region 201, as shown in FIG. 1.

So far, the production of the encapsulation structure is completed.

The method for preparing the OLED display substrate can be the same as in the above embodiment, and will not be described in detail herein.

After the preparation of the OLED display substrate and the encapsulation structure is completed, a cell alignment process is performed, and it is irradiated with the ultraviolet light to cure the UV-curable adhesive. The transparent electrode 1 is in direct electrical contact with the cathode 3 of the OLED at a position corresponding to the groove structure 10, thereby achieving parallel connection of the transparent electrode 1 and the cathode 3, as shown in FIG. 3. The cured UV-curable adhesive and the monodisperse particles 20 whose surface is wrapped with the moisture absorbing layer 22 form three layer of barriers to first block the water vapor and then to absorb the water vapor, thereby ensuring the encapsulation effect.

The above description is alternative embodiments of the present disclosure. It should be noted that one skilled in the art would make several improvements and substitutions without departing from the principles of the present disclosure. These improvements and modifications should also be regarded as the protection scope of the present disclosure.

What is claimed is:

1. A display device, comprising:
 a first base;
 a transparent electrode arranged on the first base;
 a display substrate arranged on a side of the first base proximate to the transparent electrode and opposite to the first base, the display substrate comprising a cathode located on a side of the display substrate proximate to the first base; and
 a supporting body located between the transparent electrode and the cathode and configured to electrically conduct the transparent electrode and the cathode,
 wherein the supporting body comprises monodisperse particles and a conductive layer wrapping the monodisperse particles, the transparent electrode and the cathode being electrically conducted through the conductive layer.

2. The display device of claim 1, wherein the supporting body comprises a moisture absorbing layer arranged at a periphery of the monodisperse particles, the moisture absorbing layer being configured to prevent external moisture from entering the display device.

3. The display device of claim 2, wherein a material of the moisture absorbing layer is a hygroscopic polymer selected from one or more of acrylonitrile, acrylamide, and polyvinyl alcohol, or a resin material doped with hygroscopic particles selected from one or more of $SiO_2$, $TiO_2$, CaO, and BaO.

4. The display device of claim 2, further comprises an overcoat arranged on the first base, and the groove structure is arranged on a surface of the overcoat.

5. The display device of claim 1, wherein a material of the monodisperse particles is polystyrene, polyacrylate, silica or titania.

6. The display device of claim 1, wherein the first base comprises a display region and a non-display region located at a periphery of the display region, the non-display region comprises a first sealing region, a side of the first sealing region proximate to a center of the first base is provided with a plurality of supporting bodies, the plurality of supporting bodies is arranged around a periphery of the display region.

7. The display device of claim 6, wherein the plurality of supporting bodies is arranged at equal intervals around a display panel region.

8. The display device of claim 6, wherein the display region comprises a plurality of sub-pixel regions, and each of the plurality of supporting bodies is arranged between at least a portion of two adjacent sub-pixel regions.

9. The display device of claim 8, wherein the supporting body is arranged between every two adjacent pixel regions.

10. The display device of claim 6, wherein the first base further comprises a second sealing region, the second sealing region is located between the first sealing region and the display region, and the second sealing region is provided with the supporting body.

11. The display device of claim 1, wherein the display substrate further comprises an anode located on a side of the cathode away from the first base and a light-emitting layer located between the anode and the cathode, the cathode being a plate-shaped electrode covering the entire display substrate.

12. The display device of claim 1, wherein an orthogonal projection of the cathode on the first base overlaps an orthogonal projection of the transparent electrode on the first base.

13. A method for preparing the display device of claim 1, comprising:
 providing a first base;
 forming a first transparent electrode on the base;
 preparing a display substrate arranged opposite to the first base, the display substrate comprising a cathode located on a side of the display substrate proximate to the first base; and
 forming a supporting body located between the transparent electrode and the cathode and configured to electrically conduct the transparent electrode and the cathode.

14. The method of claim 13, further comprising:
 forming an anode of the display substrate, the anode being located on a side of the cathode away from the first base; and
 forming a light-emitting layer located between the anode and the cathode, the cathode being a plate-shaped electrode covering the entire display substrate.

15. A display device, comprising:
 a first base;
 a transparent electrode arranged on the first base;
 a display substrate arranged on a side of the first base proximate to the transparent electrode and opposite to the first base, the display substrate comprising a cathode located on a side of the display substrate proximate to the first base; and a supporting body located between the transparent electrode and the cathode and configured to electrically conduct the transparent electrode and the cathode, the supporting body comprises monodisperse particles, the first base has a plurality of groove structures surrounding the monodisperse particles, and the monodisperse particles are arranged within the plurality of groove structures in one-to-one correspondence manner.

16. The display device of claim 15, wherein the display device further comprises a plurality of metal blocks, an orthogonal projection of the plurality of metal blocks on the first base falls within an orthogonal projection of the transparent electrode on the first base, and the plurality of groove structure penetrates the transparent electrode in a direction perpendicular to the first base and extends into the plurality of metal blocks.

17. The display device of claim 15, wherein a surface of the monodisperse particles is sequentially wrapped with a conductive layer and a moisture absorbing layer, and the groove structure surrounds the monodisperse particles having a surface sequentially wrapped with the conductive layer and the moisture absorbing layer.

18. The display device of claim 15, wherein the monodisperse particles having a surface wrapped with the moisture absorbing are arranged in the groove structures in one-to-one correspondence manner, the conductive layer is arranged on a side of the monodisperse particles having a surface wrapped with the moisture absorbing layer away from the first base and covers the monodisperse particles, and the conductive layer and the transparent electrode are integrated.

19. A display device, comprising:
a first base;
a transparent electrode arranged on the first base;
a display substrate arranged on a side of the first base proximate to the transparent electrode and opposite to the first base, the display substrate comprising a cathode located on a side of the display substrate proximate to the first base; and
a supporting body located between the transparent electrode and the cathode and configured to electrically conduct the transparent electrode and the cathode,
wherein the supporting body is arranged in contact with a surface of the transparent electrode facing away from the first base and conductive in a direction perpendicular to the first base, and a material for preparing the supporting body comprises a hygroscopic material.

* * * * *